(12) United States Patent
Lee

(10) Patent No.: US 11,909,132 B2
(45) Date of Patent: Feb. 20, 2024

(54) PCB HAVING EDGE ANTENNA, AND BATTERY INCLUDING PCB HAVING EDGE ANTENNA

(71) Applicant: LG Chem, Ltd., Seoul (KR)

(72) Inventor: Changjoo Lee, Daejeon (KR)

(73) Assignee: LG Energy Solution, Ltd. (KR)

( * ) Notice: Subject to any disclaimer, the term of this patent is extended or adjusted under 35 U.S.C. 154(b) by 760 days.

(21) Appl. No.: 17/043,011

(22) PCT Filed: Nov. 19, 2019

(86) PCT No.: PCT/KR2019/015842
§ 371 (c)(1),
(2) Date: Sep. 29, 2020

(87) PCT Pub. No.: WO2020/106014
PCT Pub. Date: May 28, 2020

(65) Prior Publication Data
US 2021/0013599 A1    Jan. 14, 2021

(30) Foreign Application Priority Data

Nov. 20, 2018   (KR) ........................ 10-2018-0143358

(51) Int. Cl.
*H05K 1/00*   (2006.01)
*H01Q 1/38*   (2006.01)
(Continued)

(52) U.S. Cl.
CPC ........ *H01Q 9/0464* (2013.01); *H01M 10/425* (2013.01); *H01Q 7/00* (2013.01);
(Continued)

(58) Field of Classification Search
CPC ........ H05K 1/00; H05K 1/036; H05K 1/0296; H05K 1/0243; H05K 5/0086;
(Continued)

(56) References Cited

U.S. PATENT DOCUMENTS

2004/0145528 A1   7/2004  Mukai et al.
2010/0194642 A1   8/2010  Rao et al.
(Continued)

FOREIGN PATENT DOCUMENTS

CN    1577974 A    2/2005
CN    107204519 A    9/2017
(Continued)

OTHER PUBLICATIONS

Search Report dated Jul. 28, 2022 from the Office Action for Chinese Application No. 201980026285.7 dated Aug. 8, 2022, pp. 1-3.
(Continued)

*Primary Examiner* — Thai Pham
(74) *Attorney, Agent, or Firm* — Lerner David LLP

(57) ABSTRACT

A printed circuit board (PCB) adopting an edge antenna which designs an antenna pattern in an edge region of the PCB to generate a beam pattern generated from the antenna pattern not in a vertical direction to an antenna plane but in a lateral direction of the PCB, thereby enabling face-to-face communication between large-area battery packs laterally adjacent to each other, and a battery including battery packs having the PCB.

12 Claims, 6 Drawing Sheets

(51) Int. Cl.
  *H01Q 9/04* (2006.01)
  *H01M 10/42* (2006.01)
  *H01Q 7/00* (2006.01)
  *H05K 1/02* (2006.01)

(52) U.S. Cl.
  CPC ... *H05K 1/0243* (2013.01); *H01M 2010/4278* (2013.01); *H05K 2201/10037* (2013.01); *H05K 2201/10098* (2013.01)

(58) Field of Classification Search
  CPC ........... H05K 2201/10037; H01Q 1/38; H01Q 1/422; H01Q 9/045; H01Q 9/0464; H01Q 9/0414
  See application file for complete search history.

(56) References Cited

U.S. PATENT DOCUMENTS

| | | | |
|---|---|---|---|
| 2011/0057853 A1* | 3/2011 | Kim | H01Q 9/0442 343/846 |
| 2011/0248891 A1* | 10/2011 | Han | H01Q 1/40 343/700 MS |
| 2012/0162028 A1 | 6/2012 | Kubo et al. | |
| 2013/0207869 A1* | 8/2013 | Han | H01Q 1/36 343/848 |
| 2014/0042226 A1 | 2/2014 | Lee | |
| 2015/0357685 A1 | 12/2015 | Iwasawa et al. | |
| 2016/0087348 A1 | 3/2016 | Ko et al. | |
| 2016/0248153 A1 | 8/2016 | Luo et al. | |
| 2017/0054217 A1* | 2/2017 | Hashimoto | H01Q 9/0457 |
| 2017/0085011 A1* | 3/2017 | Kim | H01Q 1/3233 |
| 2017/0093019 A1 | 3/2017 | Toh et al. | |
| 2019/0288377 A1* | 9/2019 | Ying | H01Q 9/0414 |
| 2019/0305429 A1* | 10/2019 | Ying | H01Q 5/378 |
| 2020/0028218 A1 | 1/2020 | Yamazoe et al. | |

FOREIGN PATENT DOCUMENTS

| | | |
|---|---|---|
| EP | 1496569 A1 | 1/2005 |
| JP | 2004282109 A | 10/2004 |
| JP | 2012147407 A | 8/2012 |
| KR | 20010011609 A | 2/2001 |
| KR | 20110112471 A | 10/2011 |
| KR | 20120137232 A | 12/2012 |
| KR | 20160034011 A | 3/2016 |
| KR | 20170034507 A | 3/2017 |
| WO | 2017211378 A1 | 12/2017 |
| WO | 2018095535 A1 | 5/2018 |
| WO | 2018131338 A1 | 7/2018 |

OTHER PUBLICATIONS

International Search Report for Application No. PCT/KR2019/015842 dated Mar. 3, 2020, 2 pages.
Extended European Search Report including Written Opinion for Application No. 19887593.2 dated July, 6, 2021, 3 pages.

\* cited by examiner ved Nov. 19, 2019, published in Korean, whichor more vias penetrating the insulating layer in a vertical

PCB HAVING EDGE ANTENNA, AND BATTERY INCLUDING PCB HAVING EDGE ANTENNA

CROSS-REFERENCE TO RELATED APPLICATIONS

The present application is a national phase entry under 35 U.S.C. § 371 of International Application No. PCT/KR2019/015842 filed Nov. 19, 2019, published in Korean, which claims priority from Korean Patent Application No. 10-2018-0143358 filed Nov. 20, 2018, all of which are incorporated herein by reference.

TECHNICAL FIELD

This application claims priority to and the benefit of Korean Patent Application No. 10-2018-0143358 filed in the Korean Intellectual Property Office on Nov. 20, 2018, the entire contents of which are incorporated herein by reference.

The present invention relates to a printed circuit board (PCB) adopting an edge antenna and a battery including the PCB adopting the edge antenna, and more particularly, to a PCB adopting an edge antenna which designs an antenna pattern in an edge region of the PCB to generate a beam pattern generated from the antenna pattern not in a vertical direction to an antenna plane but in a lateral direction of the PCB, thereby enabling face-to-face communication between large-area battery packs laterally adjacent to each other, and a battery including the PCB adopting the edge antenna.

BACKGROUND ART

In general, at the time of designing an antenna pattern of a PCB, a beam pattern generated from an antenna pattern layer is oriented to a vertical direction to an antenna pattern as illustrated in FIG. 1.

This has an advantage for face-to-face (face vs. face) communication of the antenna pattern in terms of communication, but there are many constraints in performing the face-to-face communication using the antenna pattern in that battery packs are arranged not in a vertical direction but in a horizontal direction in terms of a battery in which multiple battery packs are positioned laterally adjacent to each other.

SUMMARY

Technical Problem

The present invention is contrived to solve the problems and the present invention has been made in an effort to provide a PCB adopting an edge antenna which designs an antenna pattern in an edge region of the PCB to generate a beam pattern generated from the antenna pattern not in a vertical direction to an antenna plane but in a lateral direction of the PCB, thereby enabling face-to-face communication between large-area battery packs adjacent to each other, and a battery including the PCB adopting the edge antenna.

Technical Solution

According to an embodiment of the present invention, a PCB includes: a plurality of layers, including an antenna pattern layer, a feed layer, an insulating layer interposed between the antenna pattern layer and the feed layer, and a ground layer positioned at a side of the feed layer opposite the insulating layer; an antenna pattern positioned along at least part of one edge of the antenna pattern layer; and one or more vias penetrating the insulating layer in a vertical direction and vertically connecting the antenna pattern and the feed layer, wherein the antenna pattern is configured to generate a beam pattern in a direction toward an outer side of the edge of the antenna pattern layer.

In an embodiment, a length of the antenna pattern may be equal to a length of the edge of the antenna pattern layer.

According to another embodiment of the present invention, a PCB includes: a plurality of layers, including an antenna pattern layer, a feed layer, an insulating layer interposed between the antenna pattern layer and the feed layer, and a ground layer positioned at a side of the feed layer opposite the insulating layer; an antenna pattern positioned along an edge circumference of the antenna pattern layer; and one or more vias penetrating the insulating layer in a vertical direction and vertically connecting the antenna pattern and the feed layer, wherein the antenna pattern is configured to generate a beam pattern in a direction toward an outer side of the circumference of the edge of the antenna pattern layer.

In an embodiment, the antenna pattern may have a rectangular ring shape and may be integrally formed along the edge circumference of the antenna pattern layer.

According to yet another embodiment of the present invention, a PCB includes: a plurality of layers, including an antenna pattern layer, a feed layer, an insulating layer interposed between the antenna pattern layer and the feed layer, and a ground layer positioned at a side of the feed layer opposite the insulating layer; an antenna pattern positioned along two adjacent edges of the antenna pattern layer; and one or more vias penetrating the insulating layer in a vertical direction and vertically connecting the antenna pattern and the feed layer, wherein the antenna pattern is configured to generate a beam pattern in a direction toward respective outer sides of the two adjacent edges of the antenna pattern layer.

In an embodiment, the antenna pattern may have a V-shaped band shape and may be integrally formed along the two adjacent edges of the antenna pattern layer.

According to still yet another embodiment of the present invention, a battery includes: at least two adjacent battery packs, each including a PCB as described in any of the embodiments herein, in which each of the adjacent battery packs is configured to perform face-to-face communication with one another through the respective antenna patterns of the PCBs.

Advantageous Effects

According to an embodiment of the present invention, a beam pattern generated from an antenna pattern is made to be generated not in a vertical direction to an antenna plane but in a lateral direction of a PCB, thereby enabling face-to-face communication between large-area battery packs laterally adjacent to each other.

Further, according to an embodiment of the present invention, as an area for implementing the antenna pattern on the PCB is reduced, PCB design cost and a PCB design time are reduced.

In particular, the antenna pattern is designed to be adjacent to an edge plane and a beam pattern is oriented to an edge to be advantageous to edge to edge communication.

DETAILED DESCRIPTION

Hereinafter, a preferred embodiment is presented in order to assist understanding of the present invention. However, the following embodiment is just provided to more easily understand the present invention and contents of the present invention are not limited by the embodiment.

Figure 1:
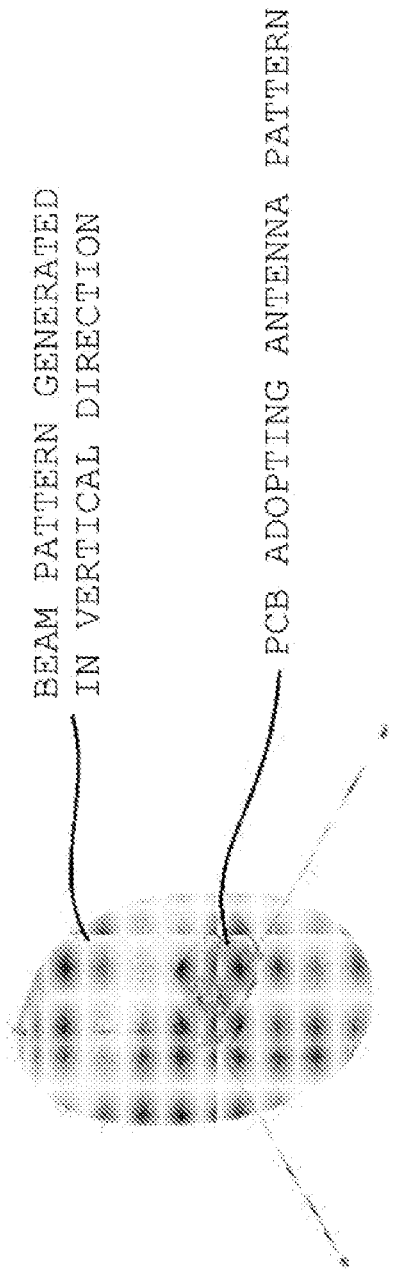
FIG. 1 is a diagram illustrating a state in which a beam pattern of a conventional antenna pattern is generated in a vertical direction to an antenna pattern plane.
Figure 2:
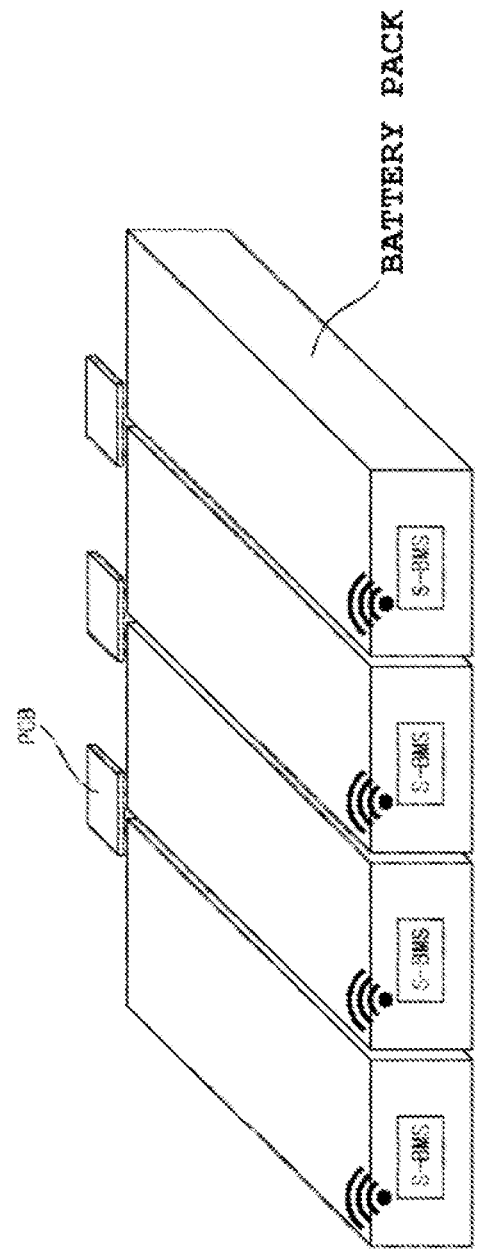
FIG. 2 is a diagram illustrating a state in which as a PCB adopting the antenna pattern illustrated in FIG. 1 is applied to multiple battery packs arranged laterally, a constraint occurs in face-to-face communication.

FIG. 2 is a diagram illustrating a state in which as a PCB adopting the antenna pattern illustrated in FIG. 1 is applied to multiple battery packs arranged laterally, a constraint occurs in face-to-face communication.

Referring to FIG. 2, at the time of configuring wireless communication between battery packs in an environment in which multiple battery packs are arranged horizontally, when a PCB is arranged horizontally to correspond to the battery pack, as a beam pattern of an antenna pattern is generated and radiated in a vertical direction of the PCB, a constraint occurs in face-to-face communication.

Accordingly, even though the PCB is horizontally arranged even in a wireless communication environment of the battery pack, technology for enabling the face-to-face communication is required using edge to edge communication.

Figure 3:
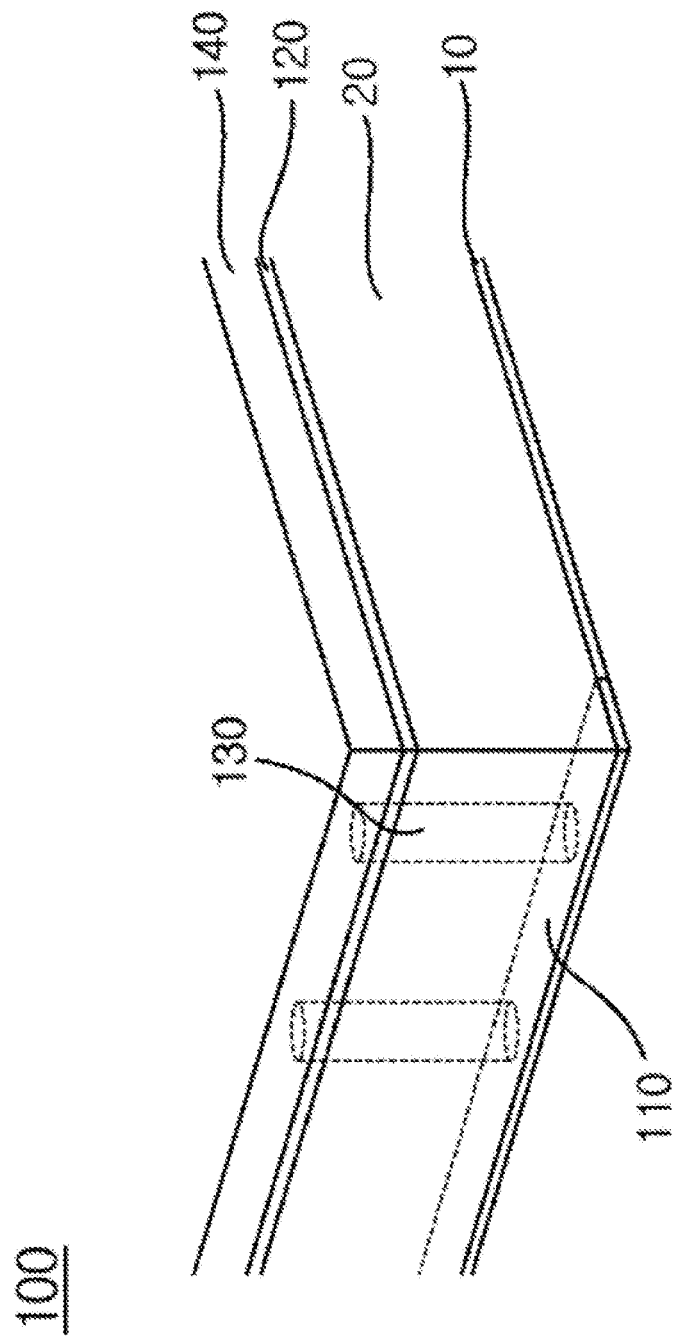
FIG. 3 is a diagram illustrating one example of a PCB 100 adopting an edge antenna according to an embodiment of the present invention.
Figure 4:
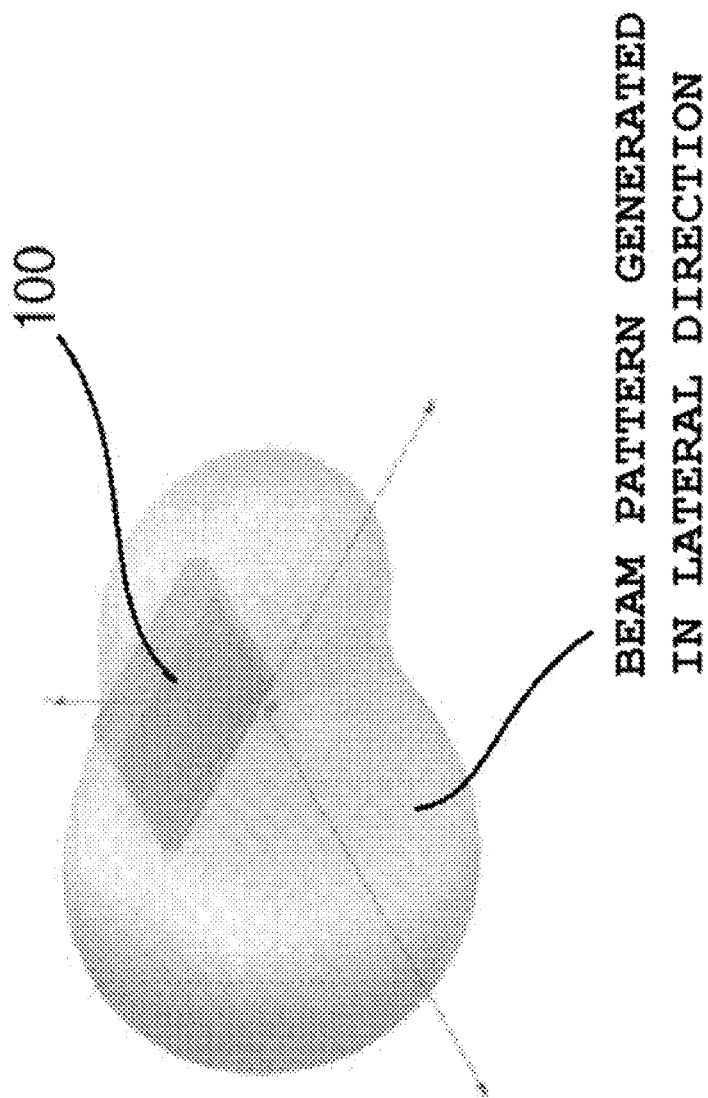
FIG. 4 is a diagram illustrating a state in which the beam pattern is generated and radiated toward a lateral side on which the antenna pattern is formed through the PCB 100 adopting the edge antenna illustrated in FIG. 3.

FIG. 3 is a diagram illustrating one example of a PCB 100 adopting an edge antenna according to an embodiment of the present invention and FIG. 4 is a diagram illustrating a state in which the beam pattern is generated and radiated toward a lateral side in which the antenna pattern is formed through the PCB 100 adopting the edge antenna illustrated in FIG. 3.

Referring to FIGS. 3 and 4, the PCB 100 adopting the edge antenna according to an embodiment of the present invention may be configured to generally include an antenna pattern 110, a feed layer 120, one or more vias 130, and a ground layer 140.

The antenna pattern 110 is provided along a partial region of an edge of the antenna pattern layer 10 positioned at a lower side among multiple layers constituting the PCB and generates and radiates the beam pattern in a specific radius.

The antenna pattern 110 is spaced apart from the feed layer 120 with an insulating layer 20 interposed therebetween and an insulating layer 20 and in this case, the antenna pattern 110 and the feed layer 120 may be electrically connected through one or more vias 130 vertically penetrating the insulating layer 20. Here, the via 130 may be a type of passage which allows the antenna pattern 110 and the feed layer 120 to be electrically connected to each other.

In this case, the antenna pattern 110 may be formed to be adjacent to a specific edge among four edges of the antenna pattern layer 10 and formed in a band shape corresponding to a length of the corresponding edge. Accordingly, an area occupied by the antenna pattern 110 in the PCB may be minimized.

Further, as the antenna pattern 110 is formed to be inclined to the edge of the antenna pattern layer 10, the beam pattern generated and radiated from the antenna pattern 110 may be widely formed in a horizontal direction facing an outer side of the edge rather than the vertical direction and this will be described through FIG. 4.

Referring to FIG. 4, the beam pattern is widely generated toward the lateral side rather than the vertical direction by the antenna pattern 110 formed in the band shape at the specific edge of the antenna pattern layer 10.

Accordingly, when the PCB 100 adopting the edge antenna is applied to the wireless communication between multiple battery packs arranged in the horizontal direction, it may be advantageous for edge to edge communication between multiple PCBs arranged in the horizontal direction to each other.

Meanwhile, the antenna pattern 110 may be provided in various forms in the antenna pattern layer 10 and this will be described through FIGS. 5 and 6.

Figure 5:
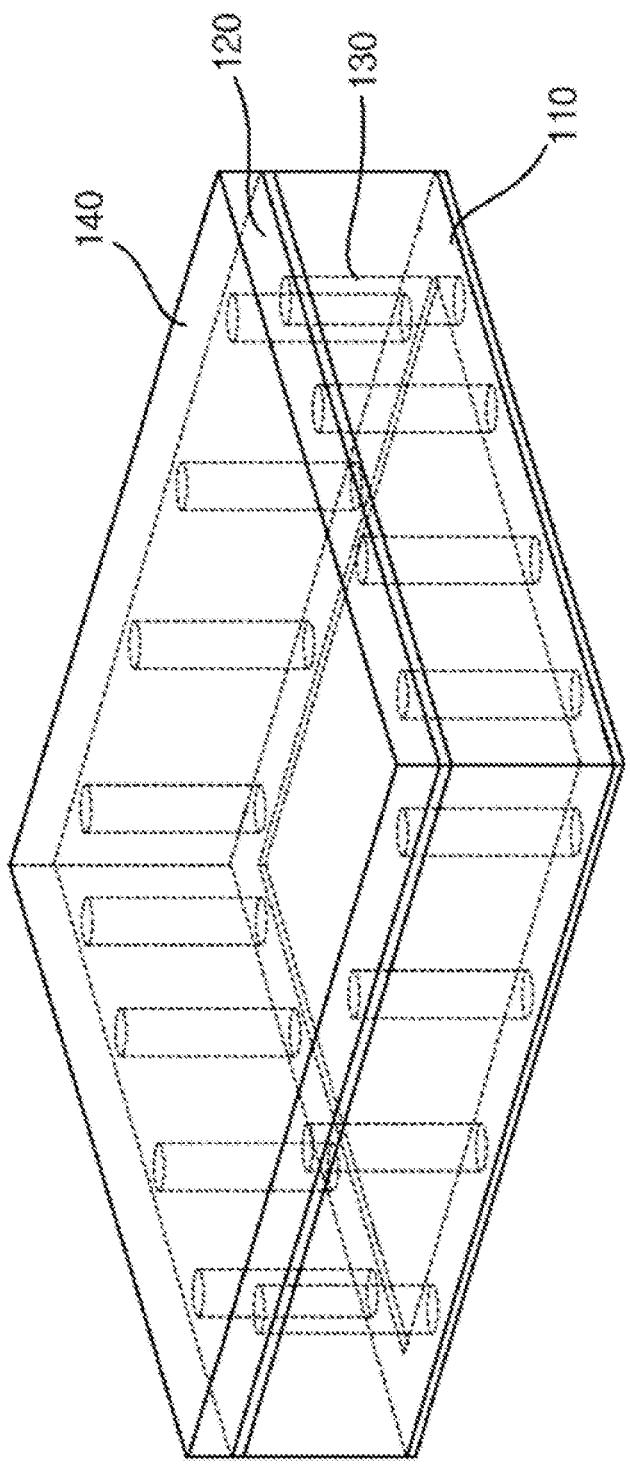
FIG. 5 is a diagram illustrating a state in which an antenna pattern 110 of the PCB 100 adopting the edge antenna according to an embodiment of the present invention is provided along not a part of an edge of an antenna pattern layer 10 but an entire circumference of the edge of the antenna pattern layer 10.

FIG. 5 is a diagram illustrating a state in which an antenna pattern 110 of the PCB 100 adopting the edge antenna according to an embodiment of the present invention is provided along not a part of an edge of an antenna pattern layer 10 but an entire circumference of the edge of the antenna pattern layer 10.

Referring to FIG. 5, if a form in which the antenna pattern 110 is provided to be inclined to any one edge among a total of four edges of the antenna pattern layer 10 in FIG. 3, then it can be seen in FIG. 5 that the antenna pattern 110 has a rectangular band shape along all edges of the antenna pattern layer 10.

In this case, since the beam pattern is generated and radiated in the lateral direction for each edge of the antenna pattern layer 10, the edge to edge communication for all lateral sides between multiple PCBs disposed in the horizontal direction is enabled.

Figure 6:
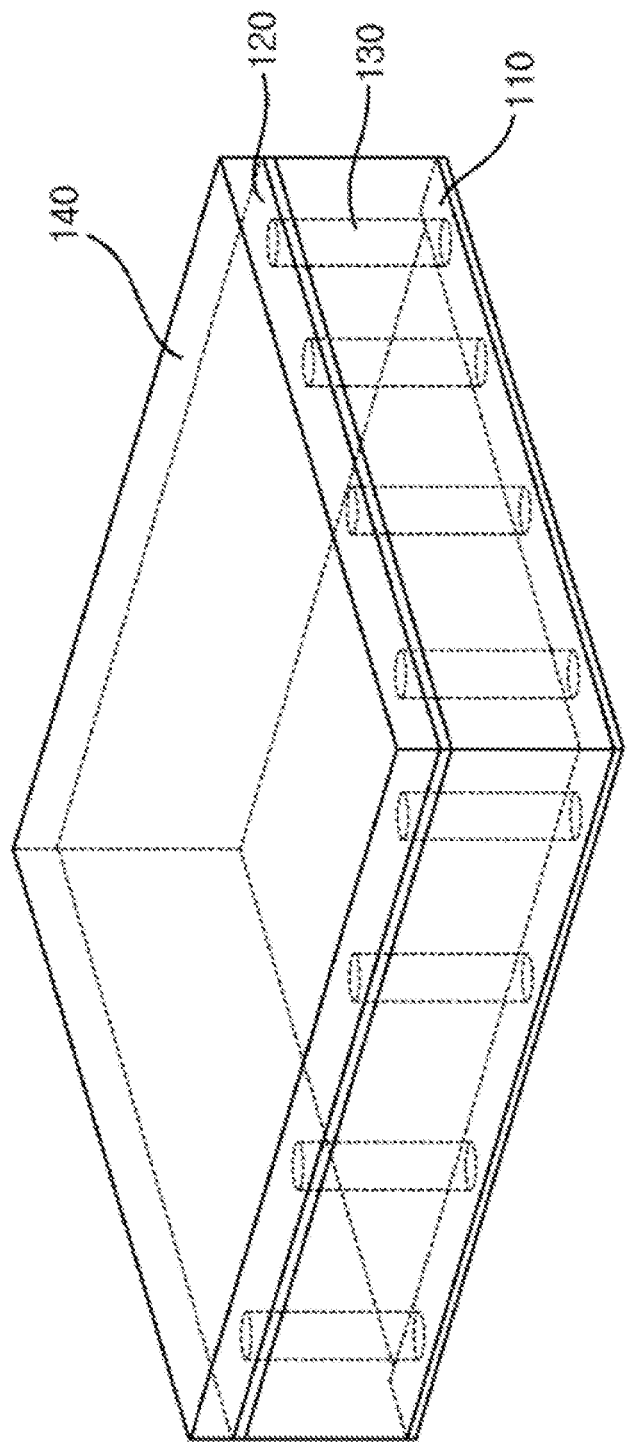
FIG. 6 is a diagram illustrating a state in which the antenna pattern 110 of the PCB 100 adopting the edge antenna according to an embodiment of the present invention is provided to be connected along two adjacent edges among four edges of the antenna pattern layer 10.

FIG. 6 is a diagram illustrating a state in which the antenna pattern 110 of the PCB 100 adopting the edge antenna according to an embodiment of the present invention is provided to be connected along two adjacent edges among four edges of the antenna pattern layer 10.

Referring to FIG. 6, if a form in which the antenna pattern 110 is provided to be inclined to any one edge among a total of four edges of the antenna pattern layer 10 in FIG. 3, then it can be seen in FIG. 6 that the antenna pattern 110 has a V-shaped band shape along two adjacent edges among four edges of the antenna pattern layer 10.

In this case, since the beam pattern is generated and intensively radiated in the lateral direction for two adjacent edges of the antenna pattern layer 10, the edge to edge communication for specific PCBs positioned adjacent to each other in the horizontal direction is enabled.

Meanwhile, in an embodiment, the PCB 100 adopting the edge antenna illustrated in FIG. 3 may be applied to the wireless communication environment of each of multiple battery packs and a battery including the PCB adopting the edge antenna may be implemented.

In this case, the battery pack may be disposed in the horizontal direction and the PCB 100 adopting the edge antenna may also be disposed in the horizontal direction and the edge to edge communication between PCBs 100 adopting respective edge antennas is enabled.

The present invention has been described with reference to the preferred embodiments of the present invention, but those skilled in the art will understand that the present invention can be variously modified and changed without departing from the spirit and the scope of the present invention which are defined in the appended claims.

The invention claimed is:

1. A printed circuit board (PCB) comprising:
 a plurality of layers, including an antenna pattern layer, a feed layer, an insulating layer interposed between the antenna pattern layer and the feed layer, and a ground layer positioned at a side of the feed layer opposite the insulating layer;
 an antenna pattern positioned along at least part of one edge of the antenna pattern layer; and
 one or more vias penetrating the insulating layer in a vertical direction and vertically connecting the antenna pattern and the feed layer,
 wherein the antenna pattern is configured to generate a beam pattern in a direction toward an outer side of the edge of the antenna pattern layer.

2. The PCB of claim 1, wherein a length of the antenna pattern is equal to a length of the edge of the antenna pattern layer.

3. A battery comprising:
 at least two adjacent battery packs, each including a PCB according to claim 2,
 wherein each of the adjacent battery packs is configured to perform face-to-face communication with one another through the respective antenna patterns of the PCBs.

4. A battery comprising:
 at least two adjacent battery packs, each including a PCB according to claim 1,
 wherein each of the adjacent battery packs is configured to perform face-to-face communication with one another through the respective antenna patterns of the PCBs.

5. A PCB comprising:
 a plurality of layers, including an antenna pattern layer, a feed layer, an insulating layer interposed between the antenna pattern layer and the feed layer, and a ground layer positioned at a side of the feed layer opposite the insulating layer;
 an antenna pattern positioned along an edge circumference of the antenna pattern layer; and
 one or more vias penetrating the insulating layer in a vertical direction and vertically connecting the antenna pattern and the feed layer,
 wherein the antenna pattern is configured to generate a beam pattern in a direction toward an outer side of the circumference of the edge of the antenna pattern layer.

6. The PCB of claim 5, wherein the antenna pattern has a rectangular ring shape and is integrally formed along the edge circumference of the antenna pattern layer.

7. A battery comprising:
 at least two adjacent battery packs, each including a PCB according to claim 6,
 wherein each of the adjacent battery packs is configured to perform face-to-face communication with one another through the respective antenna patterns of the PCBs.

8. A battery comprising:
 at least two adjacent battery packs, each including a PCB according to claim 5,
 wherein each of the adjacent battery packs is configured to perform face-to-face communication with one another through the respective antenna patterns of the PCBs.

9. A PCB comprising:
 a plurality of layers, including an antenna pattern layer, a feed layer, an insulating layer interposed between the antenna pattern layer and the feed layer, and a ground layer positioned at a side of the feed layer opposite the insulating layer;
 an antenna pattern positioned along two adjacent edges of the antenna pattern layer; and
 one or more vias penetrating the insulating layer in a vertical direction and vertically connecting the antenna pattern and the feed layer,
 wherein the antenna pattern is configured to generate a beam pattern in a direction toward respective outer sides of the two adjacent edges of the antenna pattern layer.

10. The PCB of claim 9, wherein the antenna pattern has a V-shaped band shape and is integrally formed along the two adjacent edges of the antenna pattern layer.

11. A battery comprising:
 at least two adjacent battery packs, each including a PCB according to claim 10,
 wherein each of the adjacent battery packs is configured to perform face-to-face communication with one another through the respective antenna patterns of the PCBs.

12. A battery comprising:
 at least two adjacent battery packs, each including a PCB according to claim 7,
 wherein each of the adjacent battery packs is configured to perform face-to-face communication with one another through the respective antenna patterns of the PCBs.

* * * * *